(12) United States Patent
Jung et al.

(10) Patent No.: US 7,018,924 B2
(45) Date of Patent: Mar. 28, 2006

(54) CMP SLURRY COMPOSITIONS FOR OXIDE FILMS AND METHODS FOR FORMING METAL LINE CONTACT PLUGS USING THE SAME

(75) Inventors: Jong Goo Jung, Gyeonggi-do (KR); Sang Ick Lee, Gyeonggi-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/603,976

(22) Filed: Jun. 25, 2003

(65) Prior Publication Data
US 2004/0023496 A1    Feb. 5, 2004

(30) Foreign Application Priority Data
Jul. 16, 2002    (KR) .................... 10-2002-0041774

(51) Int. Cl.
*H01L 21/4763*    (2006.01)
*C09K 13/04*    (2006.01)

(52) U.S. Cl. .................. 438/675; 438/693; 252/79.2; 252/79.3

(58) Field of Classification Search ............. 438/637, 438/675, 684, 692, 693; 252/79.1, 79.2, 252/79.3; 51/307
See application file for complete search history.

(56) References Cited

U.S. PATENT DOCUMENTS

| | | | |
|---|---|---|---|
| 5,142,828 A * | 9/1992 | Curry, II | 451/36 |
| 5,225,034 A * | 7/1993 | Yu et al. | 438/693 |
| 5,800,577 A * | 9/1998 | Kido | 51/307 |
| 5,861,054 A * | 1/1999 | Miyashita et al. | 106/3 |
| 5,877,052 A * | 3/1999 | Lin et al. | 438/238 |
| 5,994,232 A * | 11/1999 | Clampitt | 438/706 |
| 6,033,962 A * | 3/2000 | Jeng et al. | 438/301 |
| 6,060,783 A * | 5/2000 | Juengling et al. | 257/752 |
| 6,159,076 A * | 12/2000 | Sun et al. | 451/36 |
| 6,328,774 B1 * | 12/2001 | Shemo et al. | 51/307 |
| 6,436,834 B1 * | 8/2002 | Lee et al. | 438/693 |
| 6,468,910 B1 | 10/2002 | Srinivasan et al. | |

FOREIGN PATENT DOCUMENTS

| | | |
|---|---|---|
| JP | 11080708 A | 3/1999 |
| JP | 200185375 A * | 3/2001 |
| JP | 2001 288456 A | 10/2001 |

OTHER PUBLICATIONS

Suzumura et al., "Composition for Polishing," English Translation of JP 11-80708 A, JPO, Mar. 26, 1999.*
Notice of Rejection from Korean Intellectual Property Office, Jun. 18, 2004 (4 pages).

* cited by examiner

*Primary Examiner*—Stephen W. Smoot
(74) *Attorney, Agent, or Firm*—Marshall, Gerstein & Borun LLP (57) ABSTRACT

CMP slurries for oxide film and a method for forming a metal line contact plug of a semiconductor device are described herein. When a polishing process of a multi-layer film is performed by using the disclosed CMP slurry for oxide film including an $HXO_n$ compound (wherein n is an integer from 1 to 4), a stable landing plug poly can be formed by preventing step differences by reducing interlayer polishing speed differences.

17 Claims, 7 Drawing Sheets

Fig.2D

CMP SLURRY COMPOSITIONS FOR OXIDE FILMS AND METHODS FOR FORMING METAL LINE CONTACT PLUGS USING THE SAME

BACKGROUND

1. Technical Field

A chemical mechanical polishing (CMP) slurry for oxide film and a methods for forming a metal line contact plug of a semiconductor device using the same are disclosed. More particularly, the disclosed methods for forming metal line contact plugs can form a stable landing plug poly (LPP) by performing a polishing process of a multi-layer film by using the CMP slurry for oxide film including an $HXO_n$ compound (wherein n is an integer from 1 to 4).

2. Description of the Related Art

In order to provide a small, large capacity and highly integrated semiconductor device, after forming a transistor, a bit line and a capacitor for the device, a subsequent process for forming a multi-layer line such as a metal line for electrically connecting the respective elements needs to be performed.

In general, when a subsequent conventional process for forming a metal line is performed, a planarization process must be performed by polishing multiple layers simultaneously by using a single slurry before a deposition process or etching process.

However, when multiple layers are polished by using a single slurry, each layer has a different polishing speed, namely a different polishing selectivity ratio to the slurry, and thus step differences are generated between the layers which is problematic.

Further, polishing residues of each layer and abrasive residues in the slurry tend to fill the upper portion of the interlayer insulating film because of the high step difference generated in the interlayer insulating film due to its higher polishing speed than the other layers. As a result, defects such as bridges between plugs of the device are generated.

The conventional process for the semiconductor device will be explained in detail with reference to the accompanying drawings.

Figure 1A:
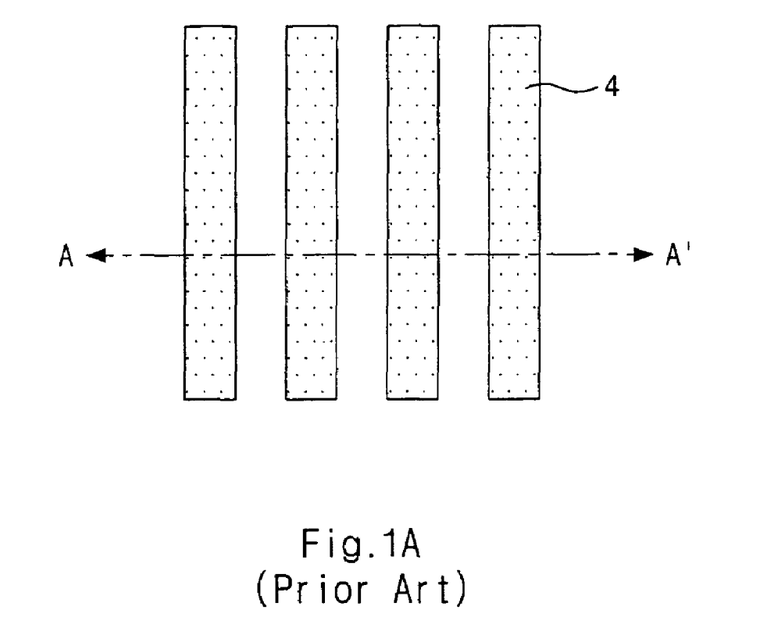
FIGS. 1A through 1F are schematic diagrams illustrating a conventional method for manufacturing a semiconductor device using a CMP process.

Referring to FIG. 1A, a process for forming a LPP is observed in a section A–A' of a plan diagram showing a general word line pattern 4.

Figure 1B:
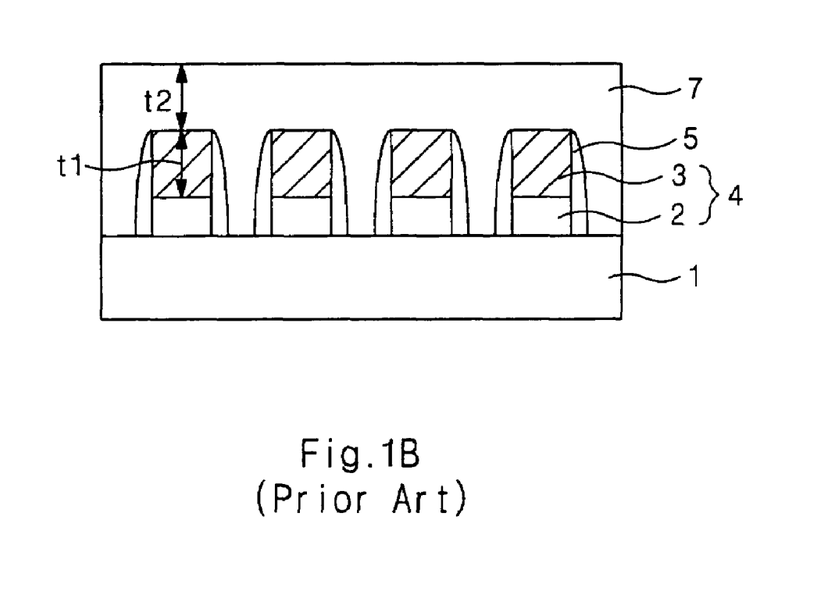

Referring to FIG. 1B, a conductive layer for word line (not shown) is deposited on a cell area of a semiconductor substrate, namely silicon substrate 1, a hard mask film (i.e., a nitride film not shown) is deposited on the conductive layer for word line at a thickness of t1 (1500 to 3200 Å). Then, word line pattern 4 having a hard mask pattern 3 on a conductive layer pattern 2 for word line is formed by sequentially etching the hard mask film and the conductive layer for word line.

A spacer 5 is formed on the sides of the resulting structure, and an interlayer insulating film 7 is formed on the entire surface of the resulting structure at a thickness of t2 (5000 to 8000 Å). The interlayer insulating film 7 is planarized.

Figure 1C:
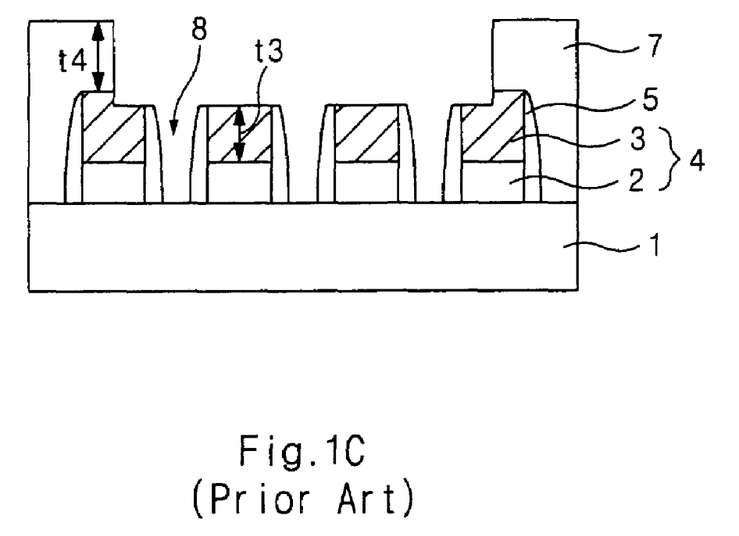

Referring to FIG. 1C, the thickness of the interlayer insulating film 7 decreases from t2 to t4 (4500 to 7500 Å) according to the planarization process (t2>t4).

An etching process for forming a contact hole 8 for plug by using a landing plug contact mask (not shown) is performed on a predetermined portion of the cell region. Here, since the upper portion of the hard mask pattern 3 is also etched, the thickness of the hard mask pattern decreases from the initial thickness t1 to t3 (1000 to 2500 Å) (t1>t3).

Figure 1D:
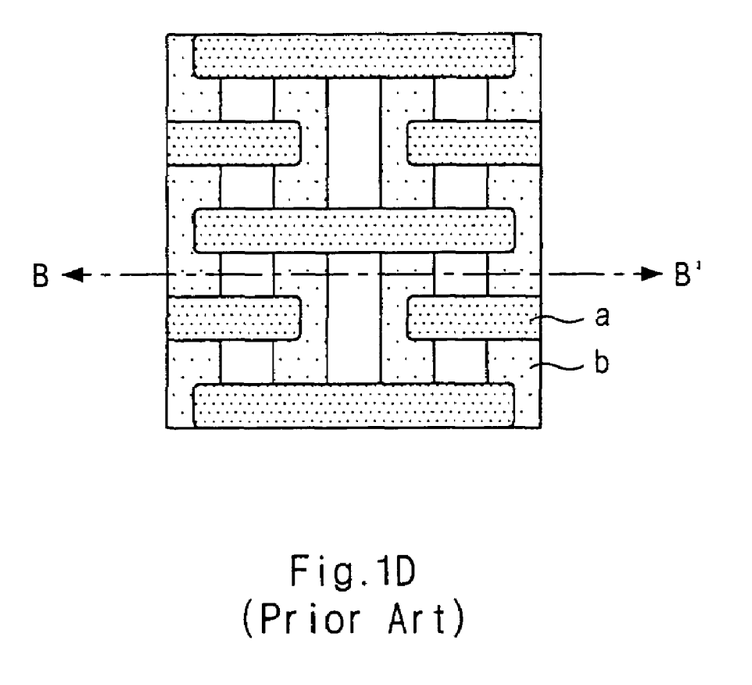

Referring to FIG. 1D, a region (a) where the contact hole 8 for plug is not formed and a region (b) where the interlayer insulating film is removed to form the contact hole 8 are formed according to the etching process. It is observed in section B–B' as shown in FIG. 1E.

Figure 1E:
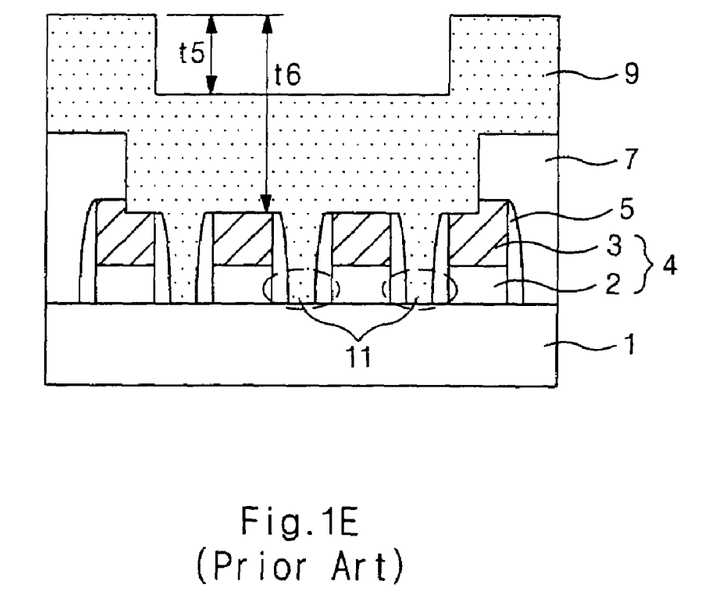

Referring to FIG. 1E, a silicon layer 9 is deposited on the entire surface of the resulting structure including the contact hole 8 for plug. Here, the silicon layer 9 has step difference of t5 (1000 to 2000 Å) due to step difference between the regions (a) and (b).

Thereafter, a plug 11 is isolated by a succeeding polishing process. Preferably, a thickness to be removed is greater than t6 (2200 to 3200 Å).

Figure 1F:
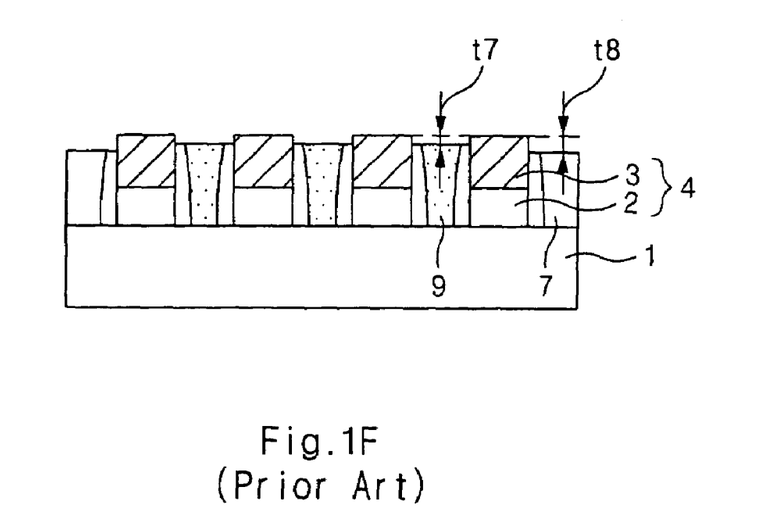

Referring to FIG. 1F, a CMP process is performed on the entire surface of the silicon layer 9 and the interlayer insulating film 7 by using a general slurry for oxide film until the hard mask pattern 3 is exposed, thereby forming the plug 11.

The slurry for oxide film used in the above CMP process is a general CMP slurry for oxide film having pH of 2 to 12 and includes an abrasive such as colloidal or fumed $SiO_2$ or $Al_2O_3$.

In general, a slurry having a similar polishing speed among the multi-layers must be used to remove a multi-layer film. However, when the general single slurry for oxide film is used in the conventional CMP process, the polishing speed of the interlayer insulating film has a higher polishing selectivity ratio than that of the word line hard mask film or silicon layer by at least three times.

Therefore, a step difference t7 of 400 to 500 Å (FIG. 1F) is generated between the hard mask nitride film pattern 3 and the silicon layer 9, and a step difference t8 of 460 to 700 Å is generated between the hard mask nitride film pattern 3 and the interlayer insulating film 7 after the polishing process due to differences of the polishing selectivity ratio.

Further, polishing residues of each layer and abrasive residues from the slurry fill in the upper portion of the interlayer insulating film 7 that has a relatively high step difference from the hard mask nitride film pattern 3.

Figure 1G:
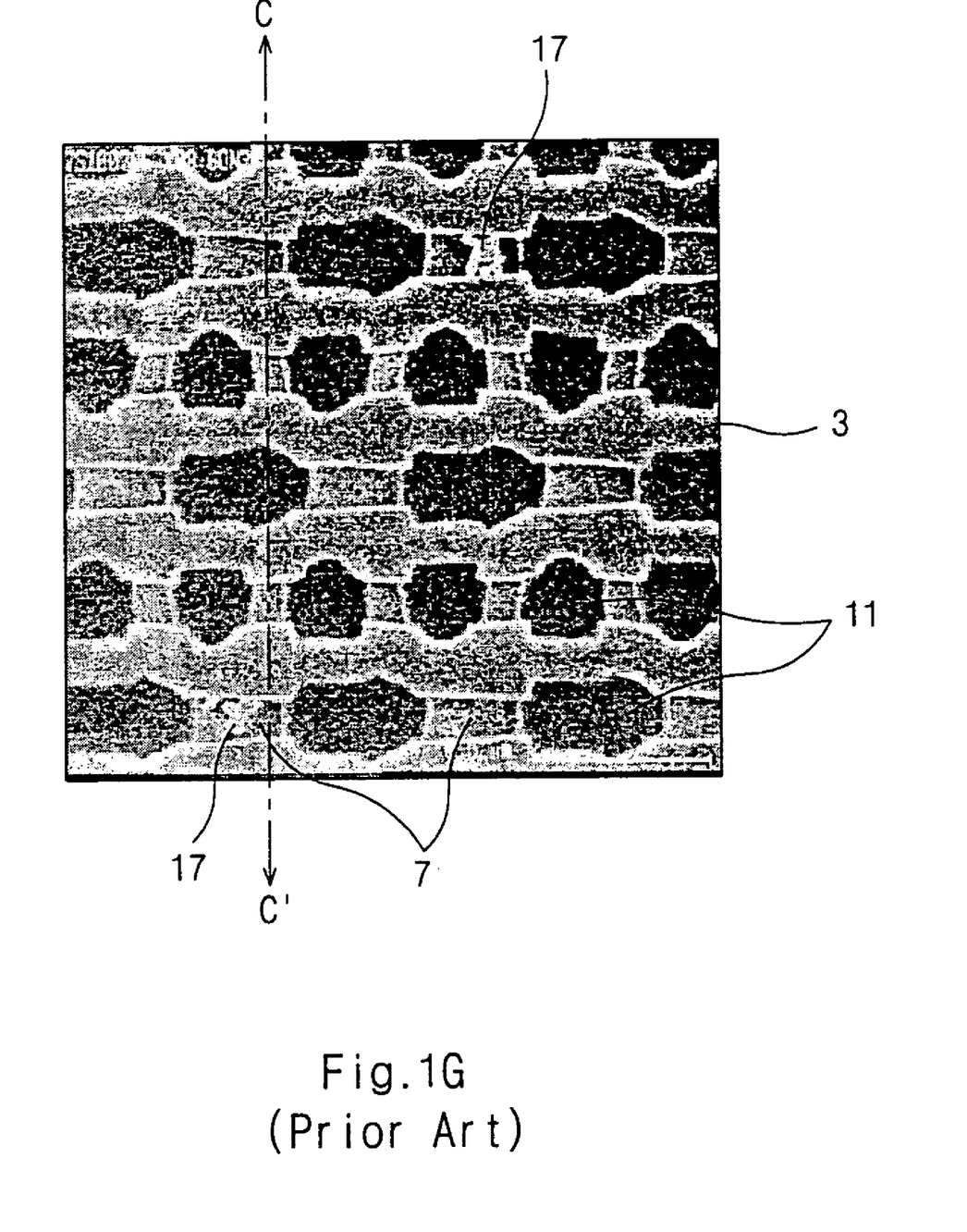
FIGS. 1G and 1H are photographs taken after a process for isolating a plug is carried out.

Referring to FIG. 1G, the abrasive residues of the CMP process are filled in the upper portion of the interlayer insulating film 7, to generate "Pinocchio" defects 17. The "Pinocchio" defects 17 are generated during the process for isolating the plug 11 due to dishing of an oxide film having a high polishing selectivity ratio to the nitride film.

Figure 1H:
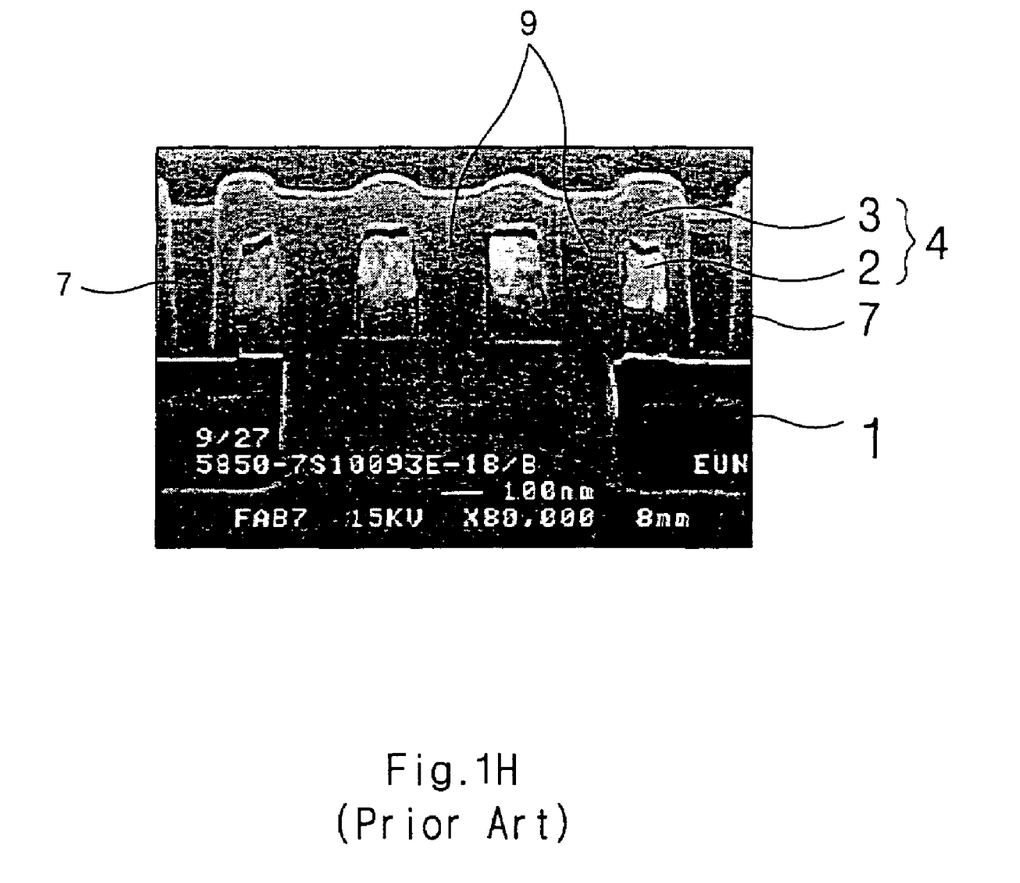

The step difference is observed in a section C–C' (FIG. 1H).

Referring to FIG. 1H, step differences are generated between the hard mask pattern 4 and the silicon layer 9, and between the hard mask pattern 4 and the interlayer insulating film 7 formed in the cell region of the substrate 1 due to differences of the polishing selectivity ratio after the polishing process using the CMP slurry for oxide film.

When the conventional single slurry is used in the CMP process for polishing the multiple layers, the step differences and Pinocchio defects are generated to form a bridge between plugs and increase leakage current. As a result, mis-alignment is generated in a succeeding process, and thus the manufacturing yield is reduced.

SUMMARY OF THE DISCLOSURE

A CMP slurry for oxide film having a similar polishing selectivity ratio to multiple layers is disclosed herein.

A method for forming a metal line contact plug of a semiconductor device which forms a stable plug by using the CMP slurry for oxide film is disclosed herein.

BRIEF DESCRIPTION OF THE DRAWINGS

The conventional

DETAILED DESCRIPTION OF THE PRESENTLY PREFERRED EMBODIMENTS

A disclosed CMP slurry composition for oxide film comprises a solvent, an abrasive dispersed in the solvent and an $HXO_n$ compound (wherein n is an integer from 1 to 4).

The solvent of the slurry composition is distilled water or ultra pure water, and the abrasive includes colloidal or fumed silica ($SiO_2$) having a grain size of 20 to 300 nm, alumina ($Al_2O_3$) or ceria ($CeO_2$).

The silica is present in an amount of 15 to 25 wt %, the alumina is present in an amount of 5 to 15 wt % and the ceria is present in an amount of 5 to 15 wt % in the slurry.

The slurry has pH below 7, preferably ranges from 2 to 5.

X of the $HXO_n$ compound is a halogen compound such as F, Cl, Br or I. Exemplary $HXO_n$ compounds include $HIO_4$, $HClO$, $HClO_3$, $HClO_4$, $HBrO_3$ or $HIO_3$, preferably $HIO_4$.

The $HXO_n$ compound is present in an amount ranging from 0.01 to 10 wt %, preferably from 0.1 to 5 wt % in the slurry.

In general, an oxide film and a silicon layer has a lower polishing selectivity ratio than the nitride film when the acid slurry is used.

Here, the $HXO_n$ compound is used as a pH control agent for increasing the polishing selectivity ratio of the nitride film and decreasing the polishing selectivity ratio of the oxide film.

That is, the CMP slurry composition for oxide film of the present invention includes the $HXO_n$ compound, and thus the polishing selectivity ratio for a nitride hard mask film to an interlayer insulating film formed of an oxide film ranges from 1:1 to 1:3, preferably from 1:1 to 1:2.

In addition, the $HXO_n$ compound is used as an oxidant for increasing the polishing speed of the silicon layer by forming an oxide film which can be easily polished on the silicon surface.

The CMP slurry composition for oxide film of the present invention comprising the $HXO_n$ compound allows the respective multiple layers to have a similar polishing selectivity ratio, so that the layers can be polished in a similar speed.

As a result, step differences are not generated between the layers after the CMP process, and thus polishing residues of each layer and slurry residues are not filled in the upper portion of the interlayer insulating film during the polishing process.

A disclosed method for forming a metal line contact plug of a semiconductor device comprises:

depositing a conductive material for word line on a semiconductor substrate;

forming a word line pattern by depositing a hard mask nitride film on the overlap portion of the conductive material for word line;

forming a nitride film spacer at the side of the word line pattern;

forming a planarized interlayer insulating film on the word line pattern;

forming a contact hole by etching the interlayer insulating film until the substrate is exposed;

forming a silicon layer on the surface of the interlayer insulating film having the contact hole; and performing a CMP process on the silicon layer and the interlayer insulating film until the hard mask nitride film is exposed, by using a CMP slurry composition for oxide film including a solvent, an abrasive dispersed in the solvent and an HXOn compound.

Preferably, the interlayer insulating film is formed of an oxide film.

The disclosure methods will be described in detail with reference to the accompanying drawings.

Many changes and modifications to the embodiments described herein can be made. The scope of some changes is discussed herein.

Figure 2A:
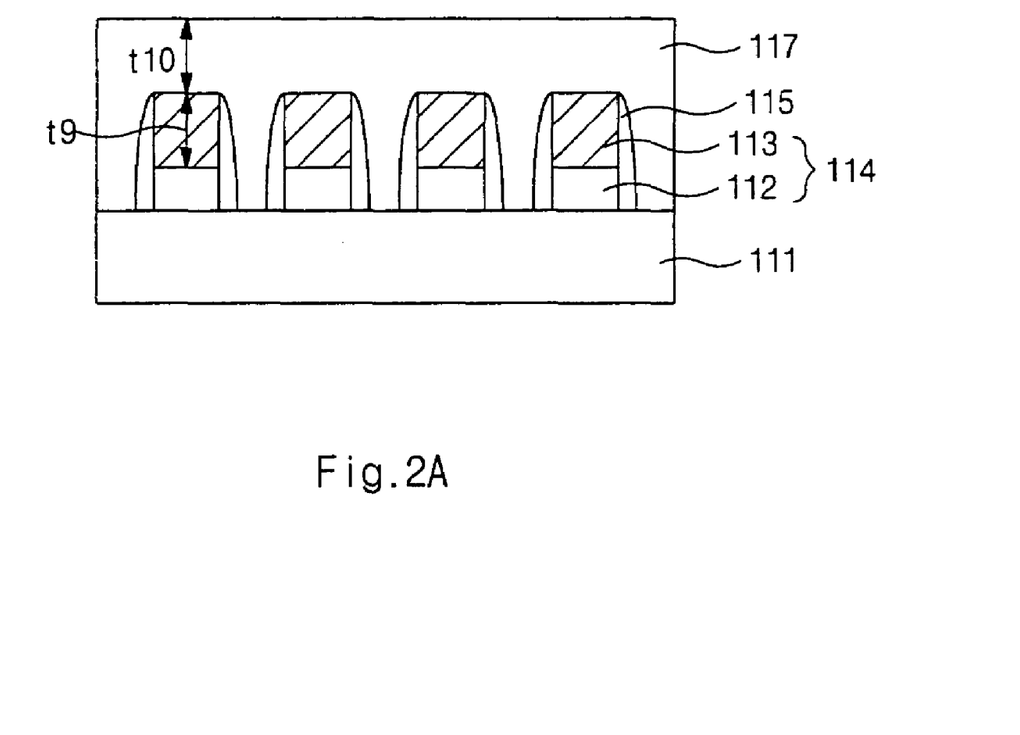
FIGS. 2A through 2D are schematic diagrams illustrating a disclosed method for forming a metal line contact plug of a semiconductor device according to a disclosed CMP process using a slurry disclosed herein.

Referring to FIG. 2A, a conductive layer for word line (not shown) is deposited on a silicon substrate 111 and a hard mask film (i.e., a nitride film not shown) is deposited on the conductive layer for word line at a thickness of t9 (1500 to 3200 Å).

A word line pattern 114 having a hard mask pattern 113 on a conductive layer pattern 112 for word line is formed by sequentially etching the hard mask film and the conductive layer for word line.

The conductive layer for word line is preferably formed by using doped silicon, polysilicon, tungsten (W), tungsten nitride (WN), tungsten silicide ($Wsi_x$) or titanium silicide ($TiSi_x$).

A word line pattern 114 is formed by a plasma etching process using a chlorine gas such as $CCl_4$ or $Cl_2$ as a source to have a high polishing selectivity ratio to a gate oxide film.

An oxide film spacer 115 is formed at the side of the word line pattern 114, by depositing TEOS(tetraethoxysilicate glass) or silane ($SiH_4$) base oxide according to a low-pressure CVD process(LP CVD), and blanket-etching the surface of the resulting structure.

An interlayer insulating film 117 is formed by depositing an oxide film at a thickness of t10 (5000 to 8000 Å) and planarized. The source of the oxide film includes BPSG (borophosphosilicate glass), PSG(phosphosilicate glass), FSG(fluorosilicate glass), PETEOS(plasma enhanced tetraethoxysilicate glass), PE-$SiH_4$(plasma enhanced-silane), HDP USG(high density plasma undoped silicate glass), HDP PSG(high density plasma phosphosilicate glass) or APL(atomic planarization layer) oxide, preferably BPSG.

Figure 2B:
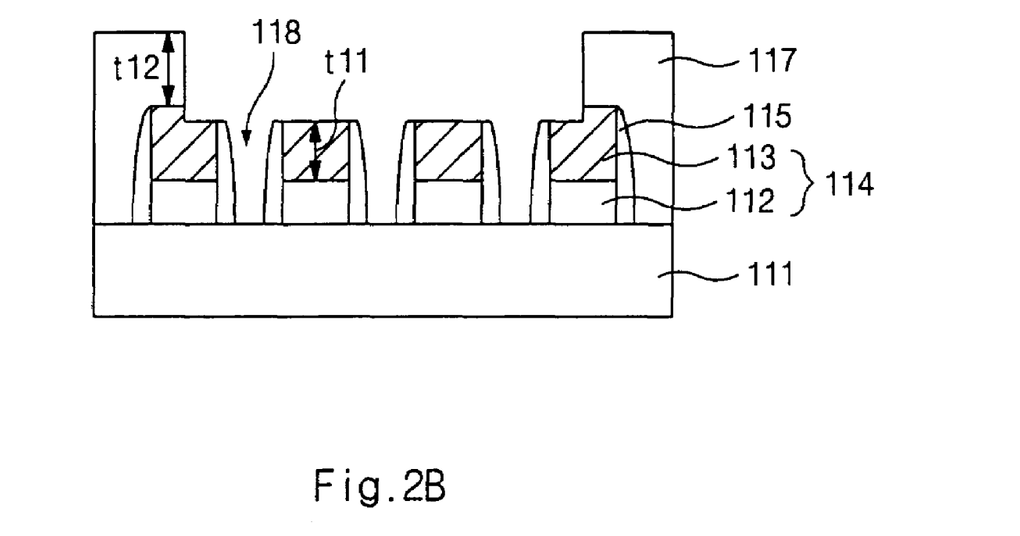

Referring to FIG. 2B, the thickness of the interlayer insulating film 117 decreases from t10 to t12 (4500 to 7500 Å) by the planarization process (t10>t12).

An etching process for forming a contact hole 118 for plug by using a landing plug contact mask (not shown) is performed in a predetermined portion of the cell region. Here, since the upper portion of the hard mask pattern 113 is also etched, the thickness of the hard mask pattern decreases from the initial thickness t9 to t11 (1000 to 2500 Å) (t9>t11).

The etching process is performed by a self-aligned contact (SAC) process using $C_4F_8$, $C_2F_6$ or $C_3F_8$ source having a high etching selectivity ratio to the nitride film, preferably $C_4F_8$ source.

Figure 2C:
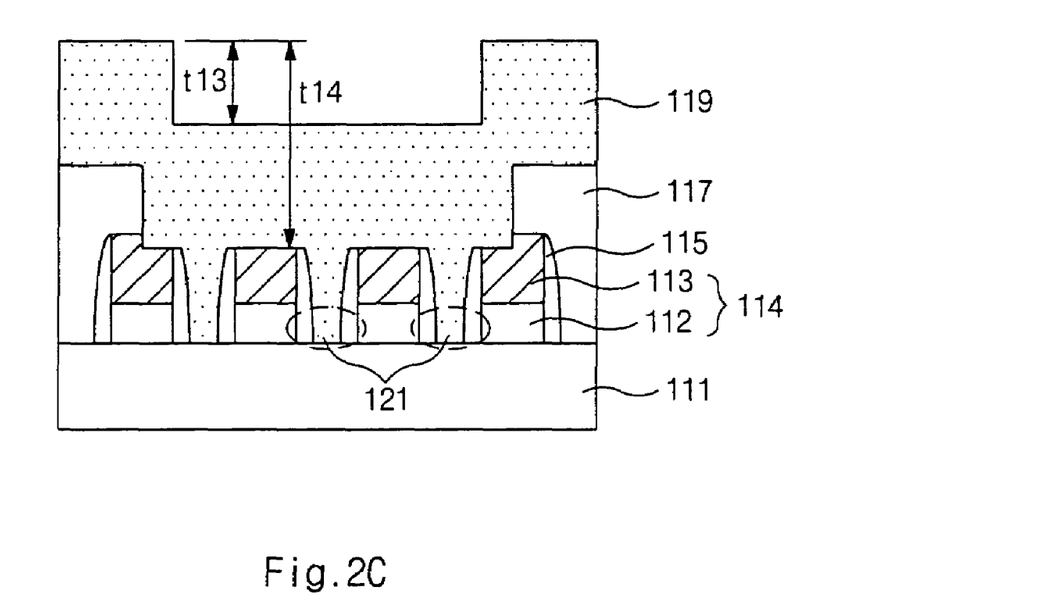

Referring to FIG. 2C, a silicon layer 119 is deposited on the entire surface of the resulting structure including the contact hole 118 for plug. Here, the silicon layer 119 has step difference of t13 (1000 to 2000 Å) due to step difference between a region where the contact hole is not formed and a region where the interlayer insulating film is removed to form the contact hole.

Preferably, the silicon layer is formed of doped silicon or polysilicon using $SiH_4$ or $Si_2H_6$ source.

A plug 121 is isolated by a succeeding polishing process. Preferably, a thickness to be removed is greater than t14 (2200 to 3200 Å).

Figure 2D:
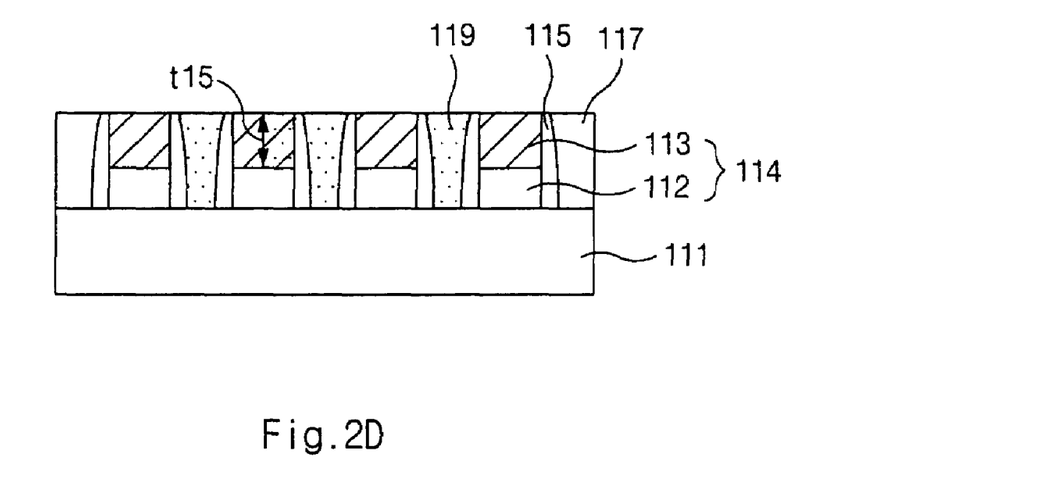

Referring to FIG. 2D, a CMP process is performed on the entire surface of the silicon layer 119 and the interlayer insulating film 117 by using a slurry including an $HXO_n$ compound until the hard mask pattern 113 is exposed, thereby isolating the plug 121.

Preferably, the CMP process is performed by using a hard pad as a polishing pad under the conditions of a polishing pressure of 2 to 6 psi and a table revolution number of 10 to 700 rpm.

Here, the table revolution number is changed according to an operation type of CMP equipment. For example, a rotary type operation is preferably performed within the range of 10 to 200 rpm, and an orbital type operation is preferably performed within the range of 100 to 700 rpm.

A linear type operation is preferably performed within the range of 100 to 700 fpm (feet per minute).

As a result, the step differences are not generated between the layers after the CMP process. Therefore, the upper portion of the interlayer insulating film is not contaminated, and a hard mask film having a thickness of t15 (500 to 1500 Å) is obtained after the polishing process.

The disclosed methods and improved devices resulting therefrom will be better understood by referring to the following examples, which are not intended to be limiting.

I. PREPARATION OF THE DISCLOSED SLURRIES

Preparation Example 1

To 95 wt % CMP slurry for oxide film including 20 wt % colloidal $SiO_2$ as abrasive was added 5 wt % $HClO_4$ and stirred. And the resulting mixture was further stirred for about 30 minutes to be completely mixed and stabilized, to prepare a slurry.

Preparation Example 2

To 90 wt % CMP slurry for oxide film including 15 wt % fumed $SiO_2$ as abrasive was added 1 wt % $HClO_3$ with stirring, and 9 wt % distilled water was mixed. Then, the mixture was further stirred for about 30 minutes to be completely mixed and stabilized, to prepare a slurry.

Preparation Example 3

To 80 wt % CMP slurry for oxide film including 10 wt % $Al_2O_3$ as abrasive was added 10 wt % $HBrO_3$ with stirring, and 10 wt % distilled water was mixed. Then, the mixture was further stirred for about 30 minutes to be completely mixed and stabilized, to prepare a slurry.

Preparation Example 4

To 90 wt % CMP slurry for oxide film including 1 wt % $CeO_2$ as abrasive was added 5 wt % $HClO$ with stirring, and 5 wt % distilled water was mixed. Then, the mixture was further stirred for about 30 minutes to be completely mixed and stabilized, to prepare a slurry.

II. CMP PROCESS BY USING DISCLOSED SLURRIES

Example 1

A silicon layer is deposited on the surface of interlayer insulating film including the contact hole for plug. Then, a CMP process is performed to remove the silicon layer on the interlayer insulating film using a common slurry for an oxide film until the interlayer insulating film is exposed.

A CMP process was performed on a silicon layer and an interlayer insulating film under a polishing pressure of 3 psi and a table revolution number of 600 rpm, by using the slurry composition of Preparation Example 1, and an orbital operation type polishing equipment until the hard mask pattern is exposed.

Step differences were not generated between the layers and the interlayer insulating film was not contaminated after the CMP process, to form a stable plug.

Example 2

A silicon layer is deposited on the surface of interlayer insulating film including the contact hole for plug. Then, a CMP process is performed to remove the silicon layer on the interlayer insulating film using a common slurry for an oxide film until the interlayer insulating film is exposed.

A CMP process was performed on a silicon layer and an interlayer insulating film under a polishing pressure of 3 psi and a table revolution number of 600 rpm, by using the slurry composition of Preparation Example 2, and an orbital operation type polishing equipment until the hard mask pattern is exposed.

Step differences were not generated between the layers and the interlayer insulating film was not contaminated after the CMP process, to form a stable plug.

Example 3

A silicon layer is deposited on the surface of interlayer insulating film including the contact hole for plug. Then, a CMP process is performed to remove the silicon layer on the interlayer insulating film using a common slurry for an oxide film until the interlayer insulating film is exposed.

A CMP process was performed on a silicon layer and an interlayer insulating film under a polishing pressure of 3 psi and a table revolution number of 600 rpm, by using the slurry composition of Preparation Example 3, and an orbital operation type polishing equipment until the hard mask pattern is exposed.

Step differences were not generated between the layers and the interlayer insulating film was not contaminated after the CMP process, to form a stable plug.

Example 4

A silicon layer is deposited on the surface of interlayer insulating film including the contact hole for plug. Then, a CMP process is performed to remove the silicon layer on the interlayer insulating film using a common slurry for an oxide film until the interlayer insulating film is exposed.

A CMP process was performed on a silicon layer and an interlayer insulating film under a polishing pressure of 3 psi and a table revolution number of 600 rpm, by using the slurry composition of Preparation Example 4, and an orbital operation type polishing equipment until the hard mask pattern is exposed.

Step differences were not generated between the layers and the interlayer insulating film was not contaminated after the CMP process, to form a stable plug.

As discussed earlier, the CMP slurry for oxide film including the HXOn compound, and the CMP process using the same allow the respective multiple layers to have a similar polishing selectivity ratio, to prevent substantial step differences from occurring after the polishing process.

Moreover, polishing residues of each layer and slurry residues are not filled in the upper portion of the interlayer insulating film, a bridge is not generated between a word line and a storage node contact, and leakage current and a mis-alignment of the succeeding process are reduced, which results in a high manufacturing yield.

What is claimed is:

1. A CMP slurry composition for oxide films comprising:
    a solvent;
    an abrasive dispersed in the solvent;
    an $HXO_n$ compound, wherein X is selected from the group consisting of F and Br and n is an integer ranging from 2 to 4; and
    wherein the CMP slurry composition has a pH ranging from 2 to 5 and a polishing selectivity ratio of a nitride film to an oxide film ranging from 1:1 to 1:3.

2. The CMP slurry composition for oxide film according to claim 1, wherein the abrasive is colloidal or fumed $SiO_2$ having a grain size of 20 to 300 nm.

3. The CMP slurry composition for oxide film according to claim 1, wherein the abrasive is $Al_2O_3$.

4. The CMP slurry composition for oxide film according to claim 1, wherein the abrasive is $CeO_2$.

5. The CMP slurry composition for oxide film according to claim 1, wherein the $HXO_n$ compound is $HBrO_3$.

6. The CMP slurry composition for oxide film according to claim 1, wherein the $HXO_n$ compound is present in an amount ranging from 0.01 to 10 wt % based on the total amount of the CMP slurry composition.

7. The CMP slurry composition for oxide film according to claim 6, wherein the $HXO_n$ compound is present in an amount ranging from 0.1 to 5 wt % based on the CMP slurry.

8. The CMP slurry composition for oxide film according to claim 1, wherein a polishing selectivity ratio of the slurry composition for a nitride film to an oxide film ranges from 1:1 to 1:2.

9. The CMP slurry composition according to claim 1, wherein said CMP slurry composition has a polishing selectivity ratio of the a polysilicon layer and an oxide film is 1:1.

10. A method for forming a metal line contact plug of a semiconductor device, comprising:
    depositing a conductive material for word line on a semiconductor substrate;
    forming a word line pattern by depositing a hard mask nitride film on the conductive material for word line;
    forming a nitride film spacer at the side of the word line pattern;
    forming a planarized interlayer insulating film on the word line pattern;
    forming a contact hole by etching the interlayer insulating film until the substrate is exposed;
    forming a silicon layer on the entire surface of the interlayer insulating film having the contact hole; and
    performing a CMP process on the silicon layer and the interlayer insulating film, by using a CMP slurry composition for oxide film of claim 1 until the hard mask nitride film is exposed.

11. The method according to claim 10, wherein the conductive material for word line is selected from the group consisting of doped silicon, polysilicon, tungsten (W), tungsten nitride (WN), tungsten silicide ($WSi_x$) and titanium silicide ($TiSi_x$).

12. The method according to claim 10, wherein the word line pattern is formed by an etching process using $CCl_4$ or $Cl_2$ gas.

13. The method according to claim 10, wherein the spacer is formed by using TEOS(tetraethoxysilicate glass) or silane ($SiH_4$)-base oxide film.

14. The method according to claim 10, wherein the interlayer insulating film is selected from the group consisting of BPSG(borophosphosilicate glass), PSG(phosphosilicate glass), FSG(fluorosilicate glass), PE-TEOS(plasma enhanced tetraethoxysilicate glass), PE-$SiH_4$(plasma enhanced-silane), HDP USG(high density plasma undoped silicate glass), HDP PSG(high density plasma phosphosilicate glass) and APL(atomic planarization layer) oxide.

15. The method according to claim 10, wherein the contact hole is formed by an etching process using $C_4F_8$, $C_2F_6$ or $C_3F_8$ source.

16. The method according to claim 10, wherein the silicon layer is formed of a doped silicon or polysilicon using $SiH_4$ or $Si_2H_6$ source.

17. The method according to claim 10, wherein the CMP process is performed by using a hard pad.

* * * * *